United States Patent [19]
Kadota et al.

[11] Patent Number: 5,793,147
[45] Date of Patent: Aug. 11, 1998

[54] SURFACE WAVE RESONATOR HAVING SINGLE COMPONENT INCLUDING A PLURALITY OF RESONANT UNITS

[75] Inventors: Michio Kadota; Kazuhiko Morozumi. both of Nagaokakyo, Japan

[73] Assignee: Murata Manufacturing Co., Ltd., Japan

[21] Appl. No.: 837,657

[22] Filed: Apr. 22, 1997

Related U.S. Application Data

[63] Continuation of Ser. No. 639,716, Apr. 29, 1996, abandoned, which is a continuation of Ser. No. 453,622, May 30, 1995, abandoned.

[30] Foreign Application Priority Data

May 30, 1994 [JP] Japan ................... 6-116975

[51] Int. Cl.[6] ............................ H03H 9/25
[52] U.S. Cl. .................. 310/313 R; 310/313 B; 310/313 D; 310/320
[58] Field of Search .................. 310/313 R, 313 B, 310/313 D, 320, 366

[56] References Cited

U.S. PATENT DOCUMENTS

| | | | |
|---|---|---|---|
| 3,763,446 | 10/1973 | Toyoshima et al. | 310/320 |
| 4,647,881 | 3/1987 | Mitsutsuka | 310/313 R |
| 5,010,269 | 4/1991 | Hikita et al. | 310/313 B |
| 5,077,545 | 12/1991 | Gopani et al. | 310/313 D |
| 5,235,235 | 8/1993 | Martin et al. | 310/313 D |

FOREIGN PATENT DOCUMENTS

| | | | |
|---|---|---|---|
| 0094683 | 11/1983 | European Pat. Off. . | |
| 0100503 | 11/1983 | European Pat. Off. . | |
| 0023609 | 1/1989 | Japan | 310/313 D |
| 5304436 | 11/1993 | Japan | 310/313 R |
| 2000409 | 1/1979 | United Kingdom | 333/195 |

OTHER PUBLICATIONS

Patent Abstracts of Japn, vol. 16, No. 312 (E-1230), Jul. 9, 1992, JP-4 87 410 A (Murata Mfg.).

"Kokusai Gihou", International Electronic Technology Bulletin, No. 16, pp. 1-7, 1992.

*Primary Examiner*—Thomas M. Dougherty
*Attorney, Agent, or Firm*—Ostrolenk, Faber, Gerb & Soffen, LLP

[57] ABSTRACT

An end face reflection type surface wave resonator utilizing SH type surface waves capable of providing a plurality of resonance characteristics is formed as a single element. In the surface wave resonator, surface waves are reflected between two opposite end faces of a piezoelectric substrate. The surface wave resonator has IDTs that form first and second resonant units. The distance L between the two end faces is selected to be within a range expressed by $(\lambda_1/2) \times N_1 \pm (\lambda_1/20)$ ($N_1$ is an integral number) where $\lambda 1$ represents the wavelength of a surface wave excited by the first resonant unit. The distance L is chosen to be out of a range expressed by $(\lambda_2/2) \times N_2 \pm (\lambda_1/20)$ ($N_2$ is an integral number) where $\lambda_2$ represents the wavelength of a surface wave excited by the second resonant unit.

10 Claims, 6 Drawing Sheets

SURFACE WAVE RESONATOR HAVING SINGLE COMPONENT INCLUDING A PLURALITY OF RESONANT UNITS

This is a Continuation of application Ser. No. 08/639,716, filed on Apr. 29, 1996, abandoned, which is a continuation of application Ser. No. 08/453,622, filed on May 30, 1995, abandoned.

BACKGROUND OF THE INVENTION

1. Field of the Invention

The present invention relates to an end face reflection type surface wave resonator utilizing SH (shear horizontal) type surface waves such as BGS (Bleustein-Gulyaev-Shimizu) waves and Love waves and, more particularly, to an end face reflection type surface wave resonator wherein a plurality of resonant units comprise a single element.

2. Description of the Related Art

Figure 1:
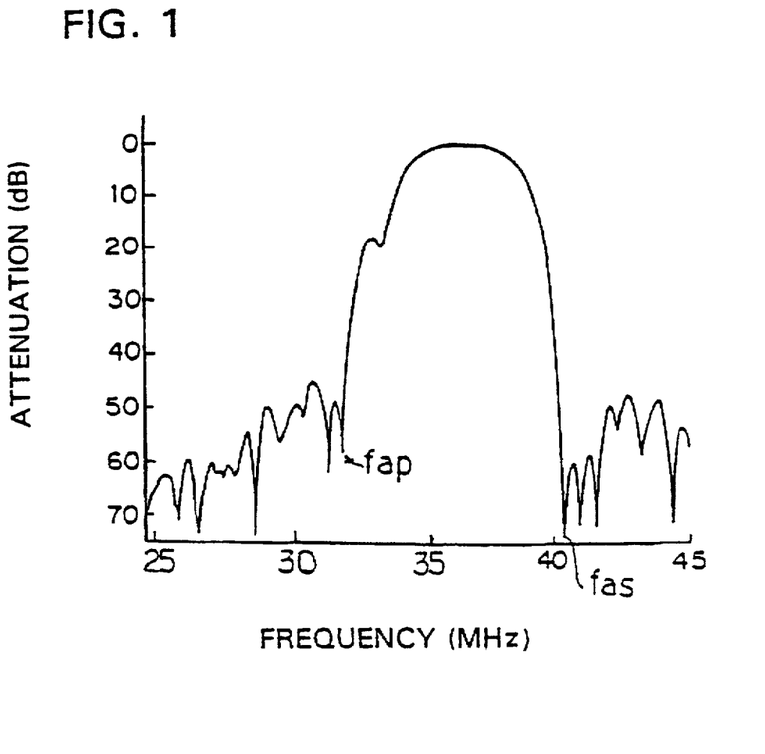
FIG. 1 illustrates a relationship between the attenuation and frequency characteristic of a video intermediate frequency circuit of a television receiver.

At a video intermediate frequency circuit of a television receiver or video tape recorder, signals must be sufficiently attenuated at the adjacent picture carrier frequency $f_{ap}$ (39.75 Mhz for NTSC type apparatuses in U.S.) and at the adjacent sound carrier frequency $f_{as}$ (47.25 Mhz for NTSC type apparatuses in U.S.) in order to prevent the problem of a beat from occurring between the circuit and the adjacent channels. FIG. 1 illustrates the relationship between the attenuation and frequency characteristic of a video intermediate frequency circuit in which a large amount of trap attenuation is maintained at the adjacent picture carrier frequency $f_{ap}$ and adjacent sound carrier frequency $f_{as}$ as described above.

In order to maintain a large amount of trap attenuation at the adjacent picture carrier frequency $f_{ap}$ and adjacent sound frequency $f_{as}$ as described above, two traps have been used, one for providing a large amount of trap attenuation at the adjacent picture carrier frequency $f_{ap}$ and one for providing a large amount of attenuation at the adjacent sound carrier frequency $f_{as}$. Each of such traps has comprised an LC resonance circuit, a piezoelectric bulk wave resonator, etc.

Figure 2:
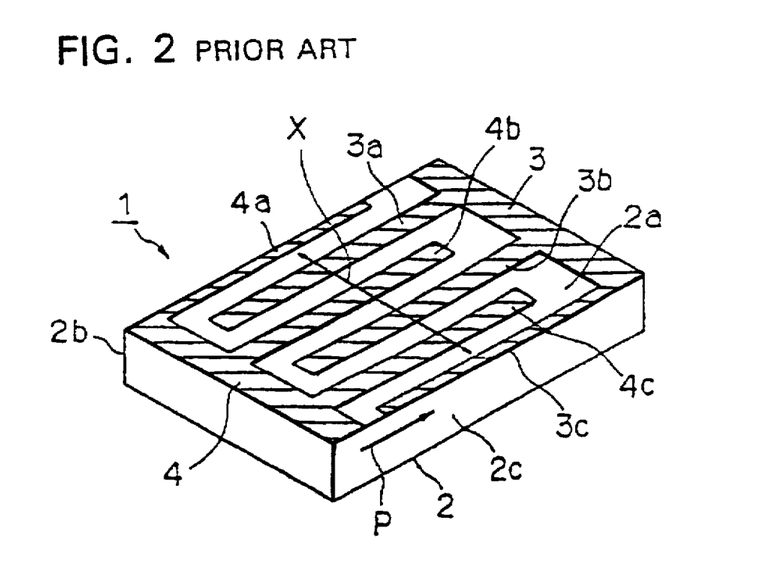
FIG. 2 is a perspective view illustrating a conventional surface wave resonator utilizing BGS waves.

Piezoelectric resonators utilizing SH type surface waves such as BGS waves are being used more frequently as piezoelectric resonators. FIG. 2 shows an example of a surface wave resonator of the end face reflection type utilizing BGS waves.

An end face reflection type surface wave resonator 1 includes a piezoelectric substrate 2 having a rectangular surface. The piezoelectric substrate 2 is made of piezoelectric materials such as lead titanate-lead zirconate type piezoelectric ceramics or piezoelectric single crystal materials including $LiNbO_3$ and $LiTaO_3$. When a piezoelectric ceramic is used, it is polarized in the direction of arrow P in FIG. 2. A pair of comb-like electrodes 3 and 4 are formed on an upper surface $2a$ of the piezoelectric substrate 2 to provide an interdigital transducer (hereinafter simply referred to an IDT). The comb-like electrodes 3 and 4, respectively, have a plurality of electrode fingers $3a$ through $3c$ and a plurality of electrode fingers $4a$ through $4c$.

An AC voltage is applied from the comb-like electrodes 3 and 4 to excite BGS waves in the end face reflection type surface wave resonator 1. The BGS waves propagate in the direction of arrow X in FIG. 2. The BGS waves are reflected between end faces $2b$ and $2c$ of the piezoelectric substrate 2.

An effective resonance characteristic is obtained in the end face reflection type surface wave resonator 1 by matching the frequency determined by the IDT and the frequency determined by the distance between the end faces $2b$ and $2c$.

However, an end face reflection type surface wave resonator as described above has only one resonance characteristic which is defined by an LC resonance circuit or a piezoelectric resonator of other types. Therefore, in order to achieve desired trapping characteristics at the two frequencies, i.e., the adjacent picture carrier frequency $f_{ap}$ and adjacent sound carrier frequency $f_{as}$, it has been necessary to prepare and connect two surface wave resonators.

Surface acoustic wave resonators utilizing Rayleigh waves with reflectors have been proposed wherein two resonance characteristics have been obtained from a single resonator (for example, as described in "Kokusai Gihou", International Electronic Technology Bulletin, No. 16, pp. 1–7, 1992). Specifically, among surface wave resonator filters utilizing Rayleigh waves, dual mode resonators utilizing a 0-dimensional longitudinal mode (basic mode) and a 2-dimensional longitudinal mode are well known. In such dual mode resonators, two or more IDTs and reflectors have been necessary to obtain two resonance characteristics. Further, the resonance characteristics of such dual mode resonators are determined by the relation between the reflection coefficient and frequency of the reflectors. Because the frequency range having a large reflection coefficient is narrow, the difference between the two resonance points is as small as approximately 1 Mhz for the range in which preferable resonance characteristics are obtained. Therefore, it has not been possible to configure a trap filter having the characteristics as shown in FIG. 1 using only such dual mode resonators.

Figure 3:
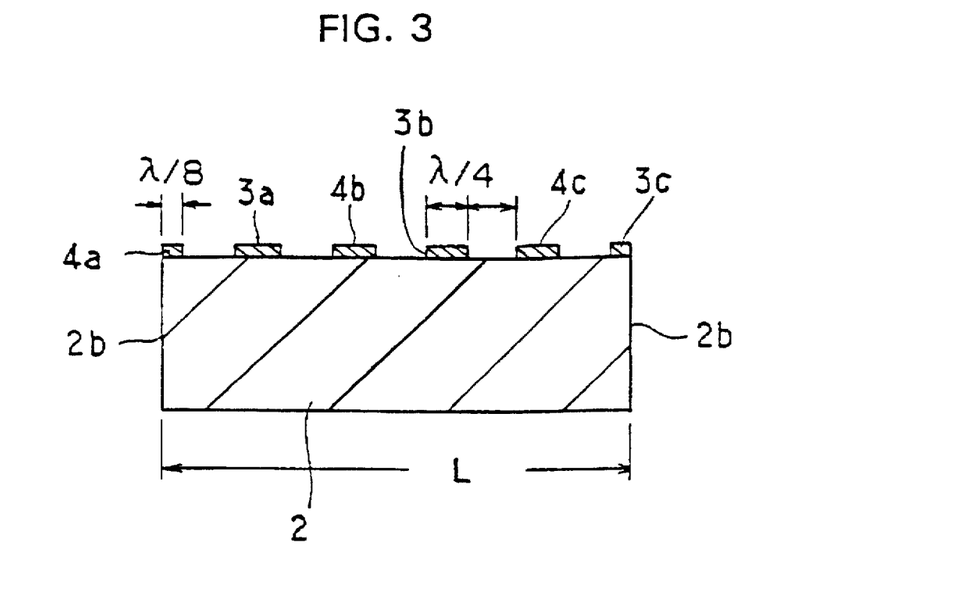
FIG. 3 is a sectional view of an end face reflection type surface wave resonator.

One approach to obtain two resonance characteristics in an end face reflection type surface wave resonator as described above may be to form two IDTs on a piezoelectric substrate to configure two resonant units. However, in an end face reflection type surface wave resonator utilizing SH type surface waves, such as BGS waves, the wavelength $\lambda$ of the IDTs and the distance L between the two opposite end faces on which the surface waves in the piezoelectric substrate are reflected have a relationship as schematically illustrated in FIG. 3, wherein $L=(\lambda/2) \times N$ (N is an integral number).

Accordingly, there is a difference in the value of the distance L between the two opposite end faces between the resonant unit whose resonance point is at the adjacent picture carrier frequency $f_{ap}$ and the resonant unit whose resonance point is at the adjacent sound carrier frequency $f_{as}$. Therefore, it has been very difficult to configure a surface wave resonator utilizing SH type surface waves by forming two resonant units of different resonance frequencies on the same substrate.

SUMMARY OF THE INVENTION

It is an object of the present invention to provide an end face reflection type surface wave resonator utilizing SH type surface waves wherein at least two resonant units of different resonance frequencies are formed as a single element.

According to a first aspect of the present invention, there is provided an end face reflection type surface wave resonator wherein shear horizontal wave type surface waves are reflected by two opposite end faces of a piezoelectric substrate, comprising a piezoelectric substrate having two opposite end faces and first and second IDTs located on the piezoelectric substrate. A first resonant unit includes the portion of the resonator where the first IDT is formed, and a second resonant unit includes the portion of the resonator where the second IDT is formed. The second resonant unit has a resonance frequency $f_2$ that is different from the resonance frequency $f_1$ of the first resonant unit. A distance L is made equal or close to $(\lambda_1/2) \times N_1$ ($N_1$ is an integral number) and $N_2$ ($N_2$ is an integral number) is chosen to make $(\lambda_2/2) \times N_2$ close to the distance L, where L represents the distance between the two opposite end faces; $\lambda_1$ represents the wavelength of a surface wave excited by the first resonant unit, and $\lambda_2$ represents the wavelength of a surface wave excited by the second resonant unit.

Specifically, the end face reflection type surface wave resonator according to the first aspect of the present invention includes first and second resonant units having different resonance frequencies provided by forming first and second IDTs on a piezoelectric substrate having two end faces disposed opposite to each other. Each of the resonant units excites SH type surface waves like the end face reflection type surface wave resonator 1 utilizing BGS waves as described above and the SH type surface waves are reflected by the two opposite end faces of the piezoelectric substrate.

In addition to BGS waves, the term "SH type surface waves" refers to general surface waves including Love waves which have components of displacement in a direction perpendicular to the direction in which the surface waves propagate.

According to the first aspect of the invention, in an end face reflection type surface wave resonator having the above-described first and second resonant units, the distance L between the two opposite end faces and the wavelengths $\lambda_1$ and $\lambda_2$ of surface waves excited by the first and second resonant units, respectively, are chosen to satisfy the relationships as described above. Specifically, the distance L is made equal or close to $(\lambda_1/2) \times N_1$ and the value of $N_2$ is chosen to make $(\lambda_2/2) \times N_2$ closer to the distance L. In a surface wave resonator according to the present invention, the first resonant unit provides a desired resonance characteristic because the distance L is set as described above. On the other hand, the value $N_2$ for the second resonant unit is determined after the resonance characteristic of the first resonant unit is set in the range as described above.

Although the distance L is made equal or close to $(\lambda_1/2) \times N_1$, it is preferably in the range of $(\lambda_1/2) \times N_1 \pm (\lambda_1/20)$. It is known that an end face reflection type surface wave resonator provides an acceptable resonance characteristic where the error of the distance L between the two opposite end faces is in the range of $\pm\lambda_1/20$. Therefore, the range defined above as equal or close to "$(\lambda_1/20) \times N_1$", i.e., the allowable range for the distance L to obtain a desired resonance characteristic from the first resonant unit, is the range of $(\lambda_1/2) \times N_1 \pm (\lambda_1/20)$ as described above.

On the other hand, it is not necessary that the distance L equals $(\lambda_2/2) \times N_2$ for the second resonant unit. It is commonly considered that, in an end face reflection type surface wave resonator, the distance L must be equal to the wavelength of a surface wave excited multiplied by ½ multiplied by an integral number. The reason is that a deviation of the distance L from such a value results in a ripple in the region of lower frequencies. In some applications, however, such a ripple at some low frequency does not create any problem. For example, a ripple in the region of frequencies lower than the resonance point of the second resonant unit may not be a problem when the resonance frequency $f_1$ of the first resonant unit is higher than the resonance frequency $f_2$ of the second resonant unit. In such a case, a deviation of the distance L from the optimum value will not be a serious problem for the second resonant unit. Therefore, although $N_2$ for the second resonant unit is chosen to make $(\lambda_2/2) \times N_2$ closer to the distance L, it is not essential that the distance L equals $(\lambda_2/2) \times N_2$. Further, the distance L may be out of the range expressed by $\frac{1}{2} \times N_2 \pm (\lambda/2/20)$.

A trap circuit for a video intermediate frequency circuit of a television receiver or a video tape recorder may be cited as an example of applications wherein no problem is caused by a ripple in the region of frequencies lower than the resonance frequency $f_2$ of the second resonant unit which is lower than the resonance frequency $f_1$ of the first resonant unit as described above. In other words, when the first resonance frequency $f_1$ is the adjacent sound carrier frequency $f_{as}$ and the second resonance frequency $f_2$ is the adjacent picture carrier frequency $f_{ap}$, there is no problem even if a ripple occurs as described above in the region of frequencies lower than the adjacent picture carrier frequency.

Accordingly, an end face reflection type surface wave resonator according to the present invention is preferably used as a resonator serving as a trap circuit in a video intermediate frequency stage as described above.

The first and second resonant units may be separated from each other by at least one groove formed on the piezoelectric substrate. In this case, one of the two end faces of each of the first and second resonant units is formed by an inner wall of the groove.

According to a second aspect of the present invention, there is provided an end face reflection type surface wave resonator utilizing SH type surface waves comprising a piezoelectric substrate having at least one groove formed on at least one surface thereof, first and second IDTs which are formed on the piezoelectric substrate with the at least one groove interposed therebetween and which serve as first and second resonant units, respectively, an inner wall of the groove serving as at least one of the two opposite end faces for reflecting surface waves of each of the first and second resonant units.

Specifically, in a surface resonator according to the second aspect of the invention, at least one groove is formed on at least one surface of the piezoelectric substrate, and the first and second resonant units are separated by the at least one groove. In this case, at least one of the two opposite end faces for reflecting surface waves of each of the first and second resonant units is formed by an inner wall of the groove.

Since the first and second resonant units are formed using a single piezoelectric substrate, this second aspect of the invention makes it possible to provide an end face reflection type surface wave resonator having a plurality of resonance characteristics using a single element like in the first aspect of the invention. Thus, the first and second aspects of the invention are similar in that they both solve the problem mentioned above.

In the context of the surface wave resonator according to the second aspect of the invention, the term "SH type surfaces waves" again refers to general surface waves such as BGS waves and Love waves which have components of displacement in a direction perpendicular to the direction in which the surface waves propagate.

In a surface wave resonator according to the first aspect of the present invention, the first and second resonant units of the end face reflection type utilizing SH type surface waves are provided using a piezoelectric substrate having two end faces disposed opposite to each other. This makes it possible to provide an end face reflection type surface wave resonator having a plurality of resonance characteristics using a single element.

According to the first aspect of the invention, since the distance L as explained above is chosen to be equal or close to $(\lambda_1/2) \times N_1$, the first resonant unit exhibits a desired resonance characteristic. On the other hand, $N_2$ for the second resonant unit is chosen so that $(\lambda_2/2) \times N_2$ is close to the distance L. As a result, when $(\lambda_2/2) \times N_2$ is not equal to the distance L or when the distance L is out of the range of $(\lambda_2/2) \times N_2 \pm (\lambda X_2/20)$, a ripple occurs in the region of frequencies lower than the second resonance frequency $f_2$. However, even with such a ripple, a trap circuit having a plurality of traps can be provided using a surface wave resonator according to the first aspect of the invention for applications in which no problem is caused by a ripple in the region of frequencies lower than the resonance frequency $f_2$ of the second resonant unit.

Other objects and features of the invention will appear in the course of the description thereof, which follows.

DETAILED DESCRIPTION OF PREFERRED EMBODIMENTS

The present invention will now be clarified by the following description which will proceed with reference to the accompanying drawings.

Figure 4:
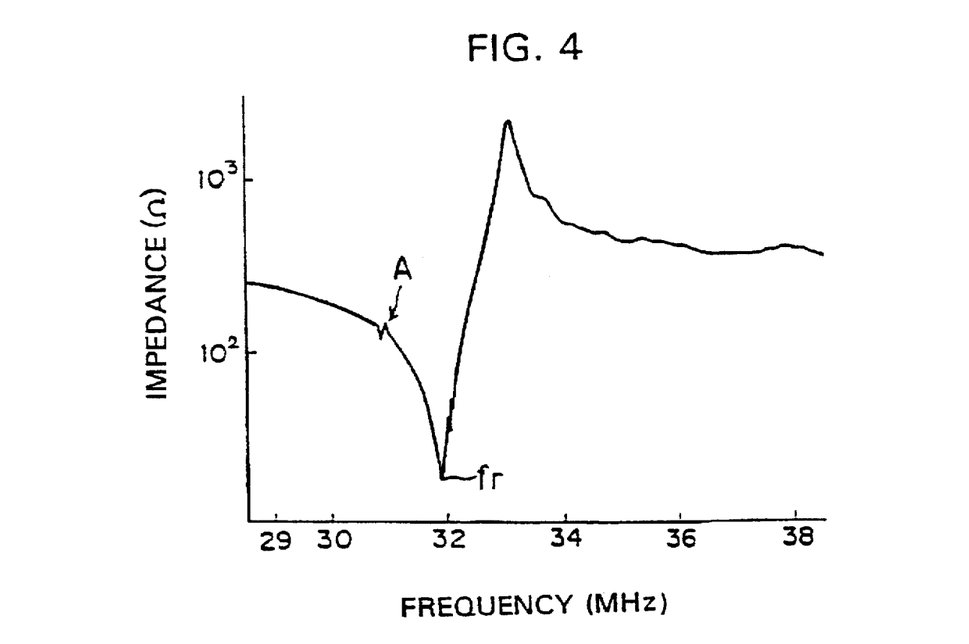
FIG. 4 illustrates a relationship between the impedance and frequency characteristic of an end face reflection type surface wave resonator with the distance between the two opposite end faces being an optimum value.
Figure 5:
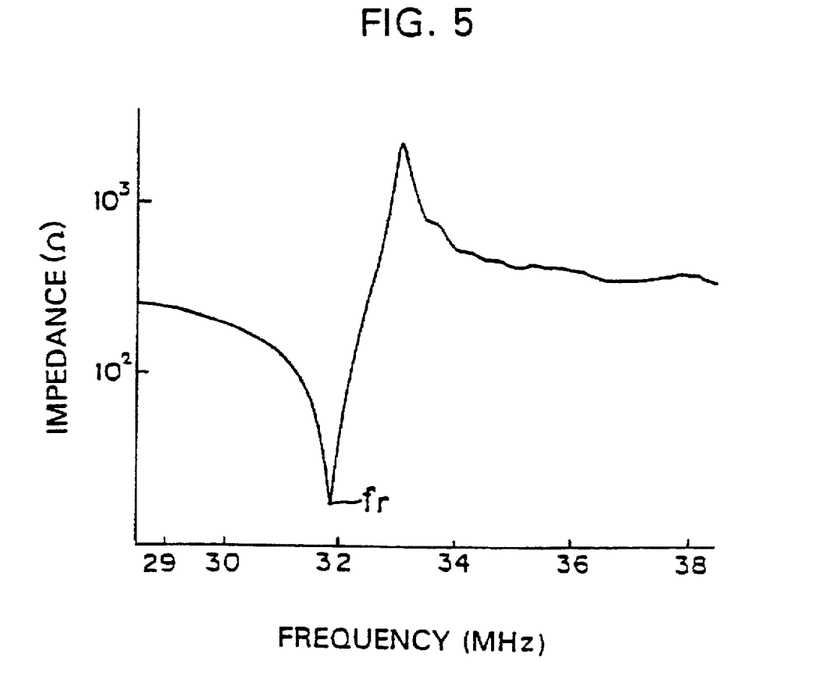
FIG. 5 illustrates a relationship between the impedance and frequency characteristic of an end face reflection type surface wave resonator with the distance between the two opposite end faces in a preferable range.

FIGS. 4 and 5 illustrate the relationship between the impedance and frequency characteristic of the end face reflection type surface wave resonator shown in FIG. 2. FIG. 4 shows a characteristic exhibited when the distance L between the two opposite end faces is $(\lambda/10)$ greater than the optimum value $(\lambda/2) \times N$ of the distance L, and FIG. 5 shows a characteristic exhibited when the distance L between the two opposite end faces is $(\lambda/20)$ greater than the optimum value $(\lambda/2) \times N$ of the distance L.

As apparent from FIG. 4, when the distance L deviates from the optimum value by $(\lambda/10)$, i.e., when the distance L between the two opposite end faces is not sufficiently accurate, such a deviation causes a ripple in the area of frequencies lower than the resonance point fr, as indicated by the arrow A.

On the other hand, as apparent from FIG. 5, when the distance L between the two opposite end faces deviates from the optimum value by $(\lambda/20)$, no ripple occurs in the area of frequencies lower than the resonance point $f_r$. Now, it will be understood that the distance L between the two opposite end faces of the end face reflection type surface wave resonator shown in FIG. 2 must be in the range of $(\lambda/2) \times N \pm (\lambda/20)$.

Assume that resonators are configured in a video intermediate frequency circuit of a television receiver and that one of the resonators resonates with the adjacent picture carrier frequency $f_{ap}$ (31.9 Mhz) and the other resonates with the adjacent sound carrier frequency $f_{as}$ (40.4 Mhz).

If the resonator resonating at 31.9 Mhz is configured using a substrate having SAW velocity of 2400 m/sec., the resonator provides a wavelength of 75.2 µm. The resonator for the adjacent sound carrier frequency $f_{as}$ (40.4 Mhz) will provide a wavelength of 59.4 µm if a substrate has a SAW velocity of 2400 m/sec.

Therefore, when the above-described two resonators are formed on the single piezoelectric substrate, the distances L between the two opposite end faces of those resonators must be made as close to each other as possible taking the difference between the wavelengths of those resonators in to account. In the above-described example, the resonator for the adjacent picture carrier frequency $f_{ap}$ will have a distance $L_{ap}$ of 300.8 µm if four pairs of electrode fingers are provided, and the resonator for the adjacent sound carrier frequency $f_{as}$ will have a distance $L_{as}$ of 297 µm if five pairs of electrode fingers are provided.

The difference between the lengths $L_{ap}$ and $L_{as}$ is 3.8 µm which value is about one-sixteenth of the wavelength 59.4 µm.

Thus, in the above-described configuration wherein a sufficient resonant characteristic is pursued for each resonator by simply adjusting the numbers of the electrode pairs of those resonators, one of the resonators can not satisfy the equation $L=(\lambda/2) \times N \pm (\lambda/20)$. In addition, when the number of electrode pairs is 4 or 5 as described above, only weak excitation of surface waves will be achieved, and the values of capacitance and impedance available will not meet the above described purpose. This makes it impossible to design resonators with flexibility to provide the capacitance and impedance optimized for the desired purpose.

In the frequency characteristic of a video intermediate frequency circuit as shown in FIG. 1, there is no ripple in between the color carrier frequency $f_c$ and the picture carrier frequency $f_p$ (i.e., between 34.47 Mhz and 38.9 Mhz), although such a ripple occurs in the position indicated by the arrow A in FIG. 4. This suggests that the ripple indicated by the arrow A in FIG. 4 does not create a problem for a video intermediate frequency circuit of a television receiver.

It will be understood that an end face reflection type surface wave resonance unit can be used as a trap for the adjacent picture carrier frequency even if the distance L between the two opposite end faces thereof is out of the range of the optimum value $\pm \lambda/20$.

From such a point of view, the inventor has found that the optimum resonators can be configured for the trap circuit as described above to be used for, for example, a video intermediate frequency by selecting the number $M_1$ of the pairs of electrode fingers for a first resonant unit such that the distance L between the two opposite end faces thereof results in the desired resonance characteristic and by selecting the number $M_2$ of the pairs of electrode fingers of a second resonant unit such that the distance L between the two opposite end faces of those resonators becomes as close to each other as possible regardless of the optimum value and allowable range for the distance.

Figure 7:
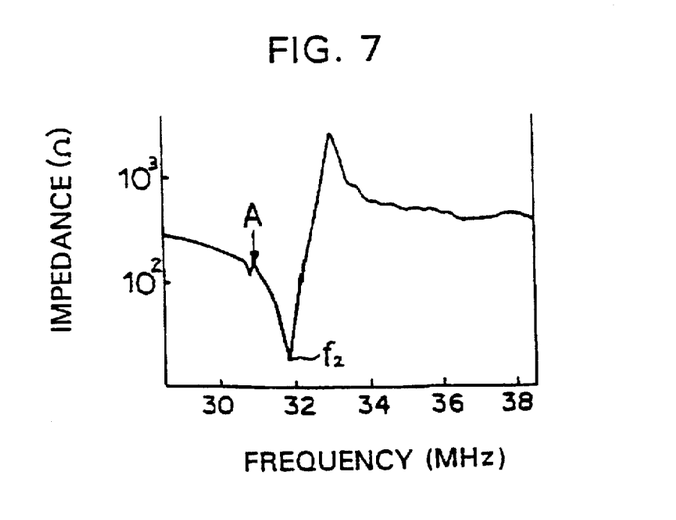
FIG. 7 illustrates a relationship between the impedance and frequency characteristic of a second resonant unit of the surface wave resonator shown in FIG. 6.
Figure 8:
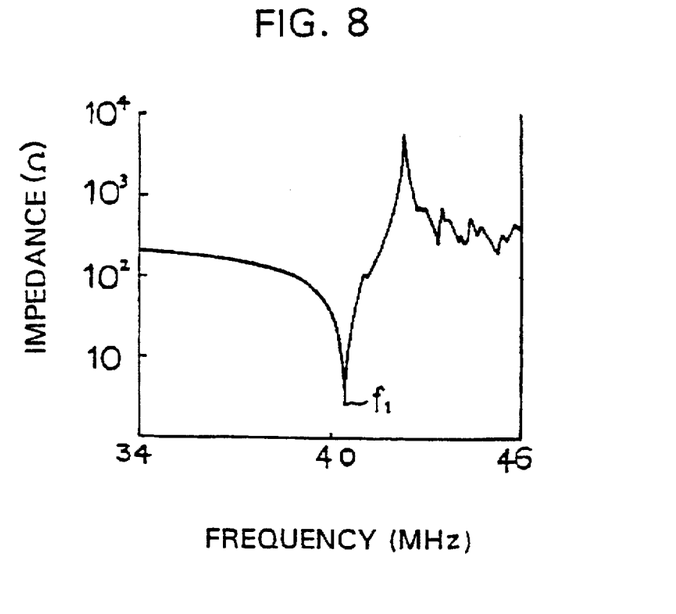
FIG. 8 illustrates a relationship between the impedance and frequency characteristics of a first resonant unit of the surface wave resonator shown in FIG. 6.

A description will now be made with reference to FIGS. 6 though 8 of the configuration and operation of an end face reflection type surface wave resonator of an embodiment according to a first aspect of the present invention.

Figure 6:
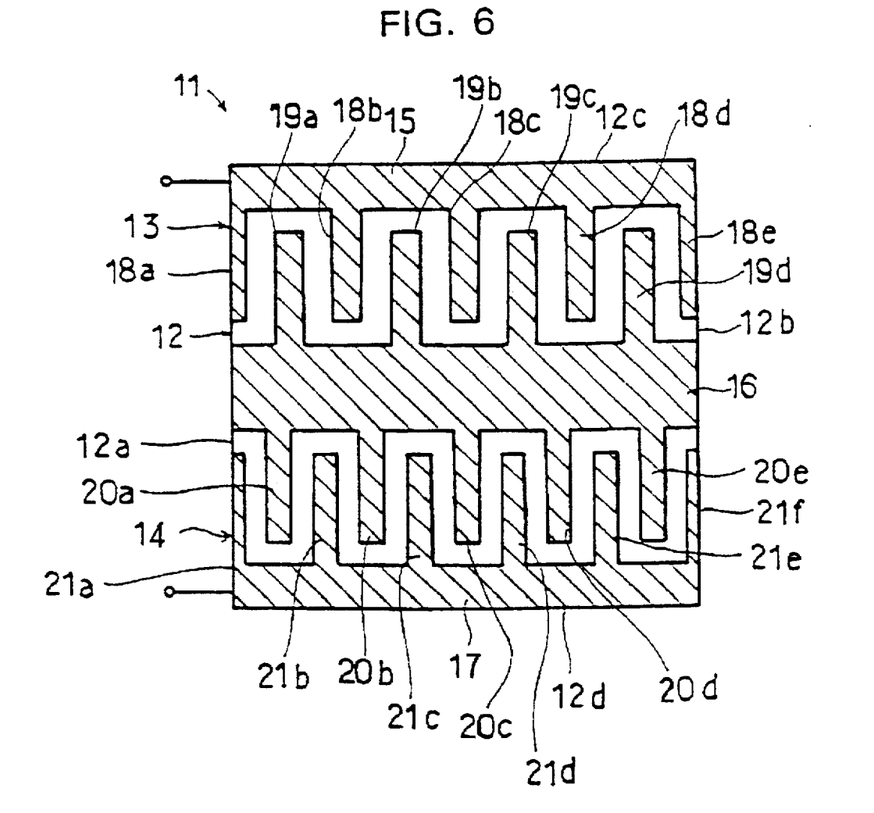
FIG. 6 is a plan view illustrating an end face reflection type surface wave resonator according to a first embodiment of the present invention.

FIG. 6 is a plan view of an end face reflection type surface wave resonator according to a first embodiment of the present invention.

An end face reflection type surface wave resonator 11 is uniformly polarized in the direction in which electrode fingers to be described later extend and is configured using a piezoelectric substrate 12 having a rectangular surface. The piezoelectric substrate 12 is preferably made of a piezoelectric ceramic such as a lead titanate-lead zirconate type piezoelectric ceramic or a piezoelectric single crystal material such as $LiTaO_3$ and $LiNbO_3$.

A first IDT 14 and a second IDT 13 are located on the upper surface of the piezoelectric substrate 12. The first IDT 14 and the second IDT 13 are provided by forming electrodes as described below.

Bus bars 15 through 17 are formed substantially parallel to side faces 12c and 12d connecting two opposite end faces 12a and 12b of the piezoelectric substrate 12. The bus bars 15 and 17 are formed along the side faces 12c and 12d, respectively. The bus bar 16 is formed in the middle of the piezoelectric substrate 12 substantially parallel to the side faces 12c and 12d.

A plurality of electrode fingers 18a through 18e are formed so that they extend from the bus bar 15 toward the bus bar 16 but do not reach the bus bar 16. Similarly, a plurality of electrode fingers 19a through 19d are formed so that they extend from the bus bar 16 toward the bus bar 15 but do not reach the bus bar 15.

The IDT 13 is constituted by a comb-like electrode formed by the bus bar 15 and plurality of electrode fingers 18a through 18e and a comb-like electrode formed by the bus bar 16 and plurality of electrode fingers 19a and 19d.

A plurality of electrode fingers 20a through 20e are formed so that they extend from the bus bar 16 toward the bus bar 17. Similarly, a plurality of electrode fingers 21a through 21f are formed so that they extend from the bus bar 17 toward the bus bar 16 but do not reach the bus bar 16.

The IDT 14 is formed by a comb-like electrode formed by the bus bar 16 and plurality of electrode fingers 20a through 20e and a comb-like electrode formed by the bus bar 17 and plurality of electrode fingers 21a and 21f.

The above-described electrode fingers have a width which is about one-fourth the wavelength of a surface wave excited by the IDTs 13 and 14 except the electrode fingers 18a, 18e, 21a and 21f formed along the end faces 12a and 12b. Each of the intervals of those electrode fingers is also about one-fourth the wavelength of a surface wave excited by the IDTs 13 and 14. The electrode fingers 18a, 18e, 21a, and 21f formed along the end faces 12a and 12b have a width which is about one-eighth the wavelength excited by the IDTs 13 and 14.

The IDTs 13 and 14 having the above-described configurations can be obtained by forming an aluminum film on the upper surface of the piezoelectric substrate 12 using thin film forming methods such as deposition, plating, and sputtering and by patterning the film using photolithography or the like. Alternatively, the IDTs 13 and 14 may be formed by screen-printing a conductive material to provide the surface configuration as shown in FIG. 6.

In the surface wave resonator 11 according to the present embodiment, a second resonant unit is formed by the area in which the IDT 13 is formed and a first resonant unit is formed by the area in which the IDT 14 is formed. The second resonant unit is a resonator serving as a trap for the adjacent picture carrier frequency, and the first resonant unit is a resonator serving as a trap for the adjacent sound carrier frequency. Electrical connection for the operation of those units may be established by connecting the bus bar 16 to a reference potential and by electrically connecting the bus bars 15 and 17 to signal lines. Thus, the surface wave resonator 11 according to the present embodiment can be used as a single electrical component having three terminals.

In the surface wave resonator 11 according to this embodiment, the distance L between the two opposite end faces 12a and 12b is 287 μm, and the SAW velocity in the piezoelectric substrate 12 is 2400 m/sec. The numbers $M_1$ and $M_2$ of the electrode fingers of the first and second resonant units are five and four, respectively. Therefore, the adjacent picture carrier frequency (31.9 Mhz) and the adjacent sound carrier frequency (40.4 Mhz) have wavelengths $\lambda ap=\lambda 2=75.2$ μm and $\lambda as=\lambda 1=59.4$ μm, respectively, in the resonators.

Thus, the resonance characteristic of the first resonant unit serving as a trap for the adjacent sound carrier frequency satisfies $L=(\lambda_1/2) \times N_1$. So it is apparent that no undesirable spurious response occurs in the region of frequencies lower than the resonance point, as shown in FIG. 8.

On the other hand, for the resonance characteristic of the second resonant unit serving as a trap for the adjacent picture carrier frequency, since the length $(\lambda_2/2) \times N_2$ thereof deviates from the above distance L by 3.8 μm, a spurious response occurs in the region of frequencies lower than the resonance point as indicated by the arrow A.

However, such a spurious response in the region of frequencies lower than the adjacent picture carrier frequency does not adversely effect the characteristics of the video intermediate frequency circuit. Therefore, the surface wave resonator 11 according to the present embodiment can be used as preferable elements serving as two traps of a video intermediate frequency circuit of a television receiver. In other words, two traps can be provided using a single element. This provides an advantage over conventional LC resonance circuits and trap circuits utilizing conventional piezoelectric resonators in that circuit configuration can be significantly simplified with a reduction in manufacturing cost.

Figure 9:
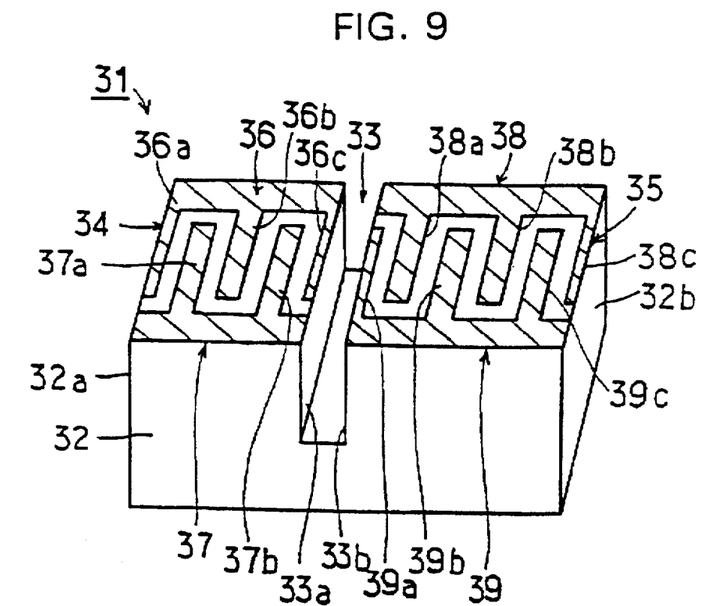
FIG. 9 is a perspective view of an end face reflection type surface wave resonator according to a second embodiment of the present invention.

FIG. 9 is a perspective view illustrating a surface wave resonator according to another embodiment of the present invention. The surface wave resonator 31 shown in FIG. 9 is an embodiment according to a second aspect of the invention and is similar to the first embodiment in that it is an element serving as a trap circuit in a video intermediate frequency circuit of a television receiver.

The surface wave resonator 31 is configured using a piezoelectric substrate 32 having a rectangular surface.

The piezoelectric substrate 32 is preferably made of a piezoelectric ceramic such as a lead titanate-lead zirconate type piezoelectric ceramic or a piezoelectric single crystal material such as $LiTaO_3$ and $LiNbO_3$.

A groove 33 is formed on the upper surface of the piezoelectric substrate 32 substantially parallel to end faces 32a and 32b facing each other. A first IDT 34 and a second IDT 35 are formed on both sides of the groove 33 to form first and second resonant units, respectively.

The IDT 34 has comb-like electrodes 36 and 37 which are arranged so that the electrode fingers thereof are interdigitated. Electrode fingers 36b, 37a, and 37b are formed to have a width which is one-fourth the wavelength of a surface wave excited by the first resonant unit and are spaced by about λ/4 from each other. The width of electrode fingers 36a and 36c on both ends is about λ/8.

The second IDT 35 similarly has a pair of comb-like electrodes 38 and 39 which are arranged so that the electrode fingers thereof are interdigitated. Electrode fingers 38a, 38b, 39b, and 39c are formed to have a width which is about one-fourth the wavelength of a surface wave excited by the second resonant unit and are spaced by about λ/4 from each other. The width of electrode fingers 39a and 38c on both ends of the second resonant unit is about one-eighth the wavelength of a surface wave excited therein.

In the surface wave resonator 31 according to the present embodiment, the first and second resonant units are separated by the groove 33. Therefore, a surface wave excited by the first resonant unit is reflected by the end face 32a and one inner wall 33a of the groove 33. Similarly, a surface wave excited by the second resonant unit is reflected by the other inner wall 33b of the groove 33 and the end face 32b. In other words, each of the inner walls 33a and 33b of the groove 33 serves as one of the end faces of the respective end face reflection type surface wave resonant units.

In the surface wave resonator 31 according to the present embodiment, two resonant units are provided using the single piezoelectric substrate 32 as described above by forming the groove 33 to use the inner walls thereof as end faces on which surface waves from the resonant units are reflected.

Thus, the present embodiment also makes it possible to provide a surface wave resonator of the end face reflection type having two different resonance characteristics using a single element.

It is therefore possible to provide traps for the adjacent picture carrier frequency and adjacent sound carrier for a video intermediate frequency circuit of a television receiver by freely selecting the numbers of the electrode fingers of the IDTs 34 and 35 and the distance between the two opposite end faces of each resonant unit.

In operation, the comb-like electrodes 37 and 39 may be interconnected to package the surface wave resonator 31 of the present embodiment into a component having three terminals.

Figure 10:
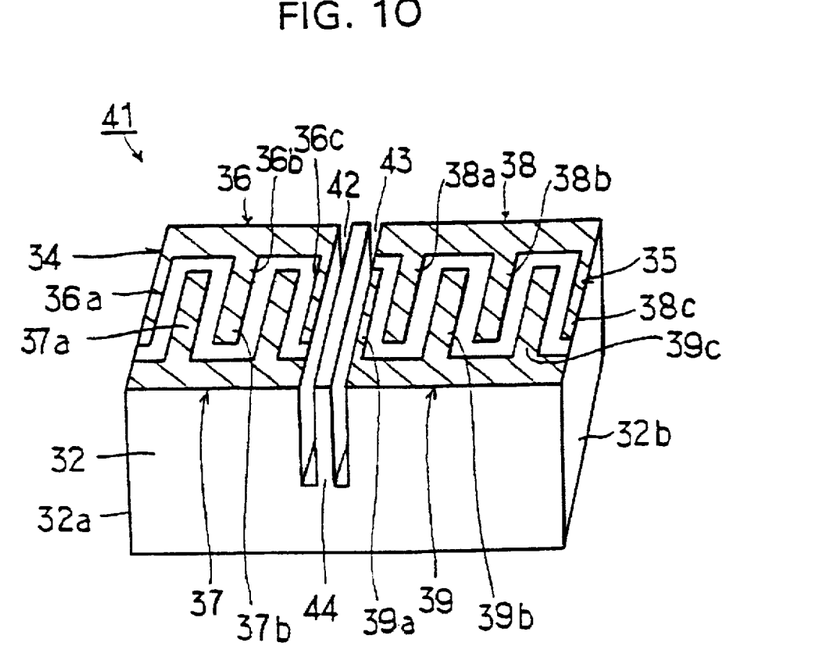
FIG. 10 is a perspective view illustrating a modification of the surface wave resonator of the embodiment shown in FIG. 9.

FIG. 10 is a perspective view showing a modification of the surface wave resonator according to the embodiment shown in FIG. 9. A surface wave resonator 41 according to this alternative embodiment has two grooves 42 and 43 formed between first and second resonant units on both ends thereof. As a result, a part 44 of the substrate remains between the grooves 42 and 43.

Since the resonator 41 is otherwise similar to the surface wave resonator 31 shown in FIG. 9, like parts are indicated by like reference numbers and will not be described.

In the surface wave resonator according to the second aspect of the invention, the first and second resonant units may be separated from each other by forming a plurality of grooves therebetween as in the surface wave resonator shown in FIG. 10.

Although not shown, according to the second aspect of the invention, one or more additional grooves may be formed between the adjacent resonant units on the side of the piezoelectric substrate opposite to that on which the IDTs are formed.

Various modifications to the present invention will become apparent to those skilled in the art from the foregoing description and accompanying drawings. Accordingly, the present invention is to be limited solely by the scope of the following claims.

What is claimed is:

1. An end face reflection type surface wave resonator comprising:
    a piezoelectric substrate of a rectangular shape, said piezoelectric substrate having a first end face and a second end face which are substantially parallel to each other and reflect shear horizontal type surface waves propagating on a surface of said piezoelectric substrate in a direction perpendicular to said first and second end faces; and
    a first interdigital transducer and a second interdigital transducer provided on said piezoelectric substrate, each of said first and second interdigital transducers including a pair of comb-like electrodes, each end of each of said first and second interdigital transducers being substantially flush with a respective one of said first and second end faces, respectively, thereby forming a first resonant unit which includes said first interdigital transducer and a portion of said piezoelectric substrate and a second resonant unit which includes said second interdigital transducer and a portion of said piezoelectric substrate,
    wherein a number $N_1$ of fingers of said first interdigital transducer is different from a number $N_2$ of fingers of said second interdigital transducer, whereby said first resonant unit has a first resonance frequency $f_1$ and said second resonant unit has a second resonance frequency $f_2$ which is different from said first resonance frequency.

2. An end face reflection type surface wave resonator according to claim 1, wherein said number $N_1$ satisfies the following inequality:

$$(\lambda_1/2) \times N_1 - \lambda/20 \leq L \leq (\lambda_1/2) \times N_1 30 \, \lambda/20$$

where $\lambda_1$ represents a wavelength of surface waves excited by said first interdigital transducer and L represents a distance between said first and second end faces.

3. An end face reflection type surface wave resonator according to claim 2, wherein said number $N_2$ satisfies either of the following inequalities:

$$L < (\lambda_2/2) \times N_2 - \lambda/20 \text{ or } (\lambda_2/2) \times N_2 + \lambda/20 < L$$

where $\lambda_2$ represents a wavelength of surface waves excited by said second interdigital transducer.

4. An end face reflection type surface wave resonator according to claim 1, wherein said number $N_2$ satisfies either of the following inequalities:

$$L < (\lambda_2/2) \times N_2 - \lambda/20 \text{ or } (\lambda_2/2) \times N_2 + \lambda/20 < L$$

where $\lambda_2$ represents a wavelength of surface waves excited by said second interdigital transducer.

5. An end face reflection type surface wave resonator according to claim 1, wherein said end face reflection type surface wave resonator is included in a trap circuit in a video intermediate frequency circuit of a television receiver and said first resonance frequency and second resonance frequency are spaced apart such that said first resonance frequency is an adjacent sound carrier frequency to be trapped and said second resonance frequency is an adjacent picture carrier frequency to be trapped.

6. An end face reflection type surface wave resonator comprising:
- a piezoelectric substrate of a rectangular shape, said piezoelectric substrate having an upper surface, first and second reflecting end faces which define two sides of said upper surface, at least one groove which is provided on said upper surface to divide said upper surface into a first region and a second region and third and fourth reflecting end faces which are provided by said at least one groove and extend from said upper face to an inside of said piezoelectric substrate;
- a first interdigital transducer provided on said first region of said upper surface, said first interdigital transducer including a pair of comb-like electrodes, each end of each of said pair of comb-like electrodes being substantially flush with a respective one of said first and third reflecting end faces, respectively; and
- a second interdigital transducer provided on said second region of said upper surface, said second interdigital transducer including a pair of comb-like electrodes, each end of each of said pair of comb-like electrodes being substantially flush with a respective one of said second and fourth reflecting end faces, respectively, whereby said first region interposed between said first reflecting end face and said third reflecting end face and said second region interposed between said second reflecting end face and said fourth reflecting end face form reflection type surface wave resonator units, respectively,
- wherein a number $N_1$ of fingers of said first interdigital transducer is different from a number $N_2$ of fingers of said second interdigital transducer, whereby said first interdigital transducer has a first resonance frequency $f_1$ and said second interdigital transducer has a second resonance frequency $f_2$ which is different from said first resonance frequency.

7. An end face reflection type surface wave resonator according to claim 6, wherein said number $N_1$ satisfies the following inequality:

$$(\lambda_1/2) \times N_1 - \lambda/20 \le L \le (\lambda_1/2) \times N_1 + \lambda/20$$

where $\lambda_1$ represents a wavelength of surface waves excited by said first interdigital transducer and L represents a distance between said first and second end faces.

8. An end face reflection type surface wave resonator according to claim 7, wherein said number $N_2$ satisfies either of the following inequalities:

$$L < (\lambda_2/2) \times N_2 - \lambda/20 \text{ or } (\lambda_2/2) \times N_2 + \lambda/20 < L$$

where $\lambda_2$ represents a wavelength of surface waves excited by said second interdigital transducer.

9. An end face reflection type surface wave resonator according to claim 6, wherein said number $N_2$ satisfies either of the following inequalities:

$$L < (\lambda/2) \times N_2 - \lambda/20 \text{ or } (\lambda_2/2) \times N_2 + \lambda/20 < L$$

where $\lambda_2$ represents a wavelength of surface waves excited by said second interdigital transducer.

10. An end face reflection type surface wave resonator according to claim 6, wherein said end face reflection type surface wave resonator is included in a trap circuit in a video intermediate frequency circuit of a television receiver and said first resonance frequency and second resonance frequency are spaced apart such that said first resonance frequency is an adjacent sound carrier frequency to be trapped and said second resonance frequency is an adjacent picture carrier frequency to be trapped.

* * * * *